(12) United States Patent
Tian (10) Patent No.: US 11,398,270 B2
(45) Date of Patent: Jul. 26, 2022

(54) INPUT BUFFER CIRCUIT, INTELLIGENT OPTIMIZATION METHOD, AND SEMICONDUCTOR MEMORY THEREOF

(71) Applicant: Changxin Memory Technologies, Inc., Anhui (CN)

(72) Inventor: Kai Tian, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 0 days.

(21) Appl. No.: 17/171,368

(22) Filed: Feb. 9, 2021

(65) Prior Publication Data

US 2021/0193216 A1   Jun. 24, 2021

Related U.S. Application Data

(63) Continuation of application No. PCT/CN2019/113898, filed on Oct. 29, 2019.

(30) Foreign Application Priority Data

Nov. 13, 2018 (CN) .......................... 201811346609.9
Nov. 13, 2018 (CN) .......................... 201821864198.8

(51) Int. Cl.
    *G11C 11/4093*   (2006.01)
    *G11C 11/4074*   (2006.01)

(52) U.S. Cl.
    CPC ...... *G11C 11/4093* (2013.01); *G11C 11/4074* (2013.01)

(58) Field of Classification Search
    CPC ............. G11C 11/4093; G11C 11/4074; G11C 11/4096
    See application file for complete search history.

(56) References Cited

U.S. PATENT DOCUMENTS

| | | | | |
|---|---|---|---|---|
| 5,659,517 A | * | 8/1997 | Arimoto | .............. G11C 5/14 |
| | | | | 365/228 |
| 7,336,108 B2 | * | 2/2008 | Takeuchi | ............ H03K 5/2481 |
| | | | | 327/544 |

(Continued)

FOREIGN PATENT DOCUMENTS

| CN | 101587745 A | 11/2009 |
|---|---|---|
| CN | 106128506 A | 11/2016 |

(Continued)

OTHER PUBLICATIONS

PCT International Search Report and the Written Opinion dated Jan. 2, 2020, issued in related International Application No. PCT/CN2019/113898 (8 pages).

*Primary Examiner* — Connie C Yoha
(74) *Attorney, Agent, or Firm* — Sheppard Mullin Richter & Hampton LLP (57) ABSTRACT

The present disclosure provides an input buffer circuit, an intelligent optimization method, and a semiconductor memory thereof. The input buffer circuit may include a detection circuit, a mode control circuit, a double-end differential circuit, and a single-end complementary metal oxide semiconductor (CMOS) unit. The detection circuit may be configured to obtain a working frequency of a chip. The mode control circuit is connected to the detection circuit, and configured to control, according to the working frequency obtained by the detection circuit, an input buffer to enter a double-end differential input mode and a single-end CMOS input mode. The double-end differential circuit and the single-end CMOS circuit are connected to the mode control circuit. The double-end differential input circuit may be configured to process high-speed data transmission in the double-end differential input mode. The single-end CMOS (Continued)

circuit may be configured to a process low-speed data transmission in the single-end CMOS input mode.

20 Claims, 4 Drawing Sheets

(56) References Cited

U.S. PATENT DOCUMENTS 8,385,137 B2 * 2/2013 Song .................. G11C 7/1057
 365/189.11
2006/0291317 A1 12/2006 Takeuchi

FOREIGN PATENT DOCUMENTS

CN 108417240 A 8/2018
CN 209001926 U 6/2019

* cited by examiner

INPUT BUFFER CIRCUIT, INTELLIGENT OPTIMIZATION METHOD, AND SEMICONDUCTOR MEMORY THEREOF

CROSS-REFERENCE TO RELATED APPLICATIONS

This application is a continuation application of International Patent Application No.: PCT/CN2019/113898, filed on Oct. 29, 2019, which is based on and claims priority to and benefits of the Chinese Patent Applications No.: 201811346609.9 and No.: 201821864198.8, both filed with the State Intellectual Property Office (SIPO) of the People's Republic of China on Nov. 13, 2018. The entire content of the above-referenced applications are incorporated herein by reference.

TECHNICAL FIELD

The present disclosure relates to a field of semiconductor technology, and in particular to an input buffer circuit, an intelligent optimization method, and a semiconductor memory thereof.

BACKGROUND

In a low power double data rate (LPDDR) DRAM, demands on power consumption and speed of a system are getting higher and higher. It is expected that a DRAM can process data of a heavy application at a higher speed, and process data of a light application with a lower power consumption. An input unit may need large power consumption when processing data at the higher speed, and may need to save power when processing data transmission at a lower speed. Therefore, designing an automatic and flexible configuration to achieve optimization between the speed and the power consumption is a problem that needs to be solved.

SUMMARY

The present disclosure provides an input buffer circuit, an intelligent optimization method, and a semiconductor memory thereof, to solve the above-mentioned technical problems in the prior art.

One aspect of the present disclosure may be directed to an input buffer circuit for an integrated circuit (IC) chip, including: a detection circuit configured to obtain a working frequency of the chip; a mode control circuit connected to the detection circuit and configured to control, according to the working frequency obtained by the detection circuit, an input buffer to enter a double-end differential input mode or a single-end complementary metal oxide semiconductor (CMOS) input mode; a double-end differential circuit connected to the mode control circuit and configured to process a high-speed data transmission in the double-end differential input mode; and a single-end CMOS circuit connected to the mode control circuit and configured to process a low-speed data transmission in the single-end CMOS input mode.

In one embodiment of the present disclosure, the detection circuit may include: a first clock counter configured to receive and count a clock signal of the chip; a second clock counter configured to receive and count an internal clock signal of the input buffer circuit; and a comparator respectively connected to the first clock counter and the second clock counter, configured to compare counting results of the first clock counter and the second clock counter, and output the working frequency.

In one embodiment of the present disclosure, the detection circuit may include temperature input pin connected to a temperature sensing circuit located in the chip, to receive a working temperature sensed by the temperature sensing circuit of the chip.

In one embodiment of the present disclosure, the detection circuit may include: an internal register connected to the mode control circuit, configured to register a working frequency band corresponding to the working frequency of the chip, a write latency, and a reference voltage, and configured to register a refresh rate reflecting the working temperature of the chip; and the mode control circuit is configured to obtain the working frequency of the chip from the internal register according to a relationship among the working frequency band, the write latency and the working frequency, and a relationship between the reference voltage and the working frequency, and further configured to obtain the working temperature of the chip according to the refresh rate.

In one embodiment of the present disclosure, the input buffer circuit may further include an adjustment circuit comprising an input pin connected to the mode control circuit and an output pin connected to the double-end differential circuit, and configured to adjust, in the double-end differential input mode, a bias current according to the working temperature and the working frequency obtained by the mode control circuit.

In one embodiment of the present disclosure, the adjustment circuit may include: a first p-channel metal oxide semiconductor (PMOS) comprising a source connected to a power, a gate shorted with a drain, and the gate connected to the double-end differential circuit for generating a bias current of the double-end differential circuit; a first n-channel metal oxide semiconductor (NMOS) comprising a drain connected to the drain of the first PMOS; an amplifier comprising an output pin connected to a gate of the first NMOS, and a first input pin connected to the reference voltage; and an adjustable resistor circuit comprising an first pin respectively connected to a source of the first NMOS and a second input pin of the amplifier, and an second pin being grounded; wherein the mode control circuit is connected to the adjustable resistor circuit, and configured to adjust and control, in the double-end differential input mode, a resistance of the adjustable resistor circuit to adjust the bias current according to the working temperature and the working frequency obtained by the detection circuit.

In one embodiment of the present disclosure, the adjustable resistor circuit may include: a first fixed-value resistor comprising one end being grounded; and an adjustable resistor connected to the other end of the first fixed-value resistor, and comprising N serially-connected resistor groups, wherein each of the resistor groups comprises a second NMOS and a second fixed-value resistor, a source and a drain of each second NMOS are respectively connected to two ends of each second fixed-value resistor, and a gate of each second NMOS is connected to the mode control circuit.

In one embodiment of the present disclosure, the double-end differential circuit may include: a second PMOS comprising a source connected to the power and a gate connected to a bias voltage; a third PMOS comprising a source connected to a drain of the second PMOS and a gate used as a data input pin of the double-end differential circuit; a fourth PMOS comprising a source connected to the drain of the second PMOS and a gate connected to the reference voltage; a third NMOS comprising a drain connected to a drain of the third PMOS, a source being grounded, and a gate shorted with the drain; a fourth NMOS comprising a drain connected to a drain of the fourth PMOS, a source being grounded, and a gate connected to the gate of the third NMOS; a fifth PMOS comprising a source connected to the power, a drain connected to a connection line connecting the drain of the fourth NMOS and a drain of the fourth PMOS, and a gate connected to an enable signal; and a first CMOS inverter, comprising two ends respectively connected to the power and a ground, an input pin connected to the drain of the fifth PMOS, and an output pin used as a data output pin of the double-end differential circuit.

In one embodiment of the present disclosure, the single-end CMOS circuit may include: a second CMOS inverter comprising one end connected to the power and an input pin used as a data input pin of the single-end CMOS circuit; a fifth NMOS comprising a drain connected to the other end of the second CMOS inverter, a gate connected to the enable signal, and a source being grounded; a sixth PMOS comprising a source connected to the power, a gate connected to the enable signal, and a drain connected to an output pin of the second CMOS inverter; and a third CMOS inverter comprising two ends respectively connected to the power and the ground, an input pin connected to a drain of the sixth PMOS, and an output pin used as a data output pin of the single-end CMOS circuit.

One aspect of the present disclosure may be directed to an intelligent optimization method of an input buffer circuit, including: obtaining working frequency information of a chip; when a working frequency of the chip is in a medium or high frequency band, controlling an input buffer to process a high-speed data transmission in a double-end differential input mode; and when the working frequency of the chip is in a low frequency band, controlling the input buffer to process a low-speed data transmission in a single-end complementary metal oxide semiconductor (CMOS) input mode.

In one embodiment of the present disclosure, after controlling the input buffer to operate in the double-end differential input mode when a working frequency of the chip is in a medium or high frequency band, the method may further comprise: obtaining a working temperature of the chip; when the input buffer operates in the double-end differential input mode and the obtained working temperature and working frequency are in the high band, adjusting a resistance of an adjustable resistor to increase a bias current of a double-end differential circuit; and when the input buffer operates in the double-end differential input mode and the obtained working temperature and working frequency are in the medium band, adjusting the resistance of the adjustable resistor to decrease the bias current of the double-end differential circuit.

In one embodiment of the present disclosure, the method may further comprise: registering a working frequency band corresponding to the working frequency in an internal register; and registering a refresh rate corresponding to the working temperature in an internal register.

In one embodiment of the present disclosure, the method may further comprise obtaining the working frequency according to correlations among the working frequency band, a write latency, the working frequency, and a reference voltage of the input buffer.

In one embodiment of the present disclosure, the method may further comprise obtaining the working temperature according to the fresh rate.

In one embodiment of the present disclosure, the method may further comprise adjusting the reference voltage of the input buffer according to the working frequency.

One aspect of the present disclosure may be directed to a semiconductor memory including the above-mentioned input buffer circuit in any implementation manner.

By adopting the above technical solution, the present disclosure has the following advantages: the input buffer provided by the present disclosure selects a high-speed data processing mode for a heavy application to improve a data processing speed, and selects to process low-speed data transmission for a light application to reduce the circuit power consumption, thereby achieving the maximum optimization between the data processing speed and the power consumption, and meeting the requirements of different users and different application conditions.

The above summary is merely for describing the specification and does not limit the present disclosure in any manner. Besides the above described schematic aspects, implementation manners, and characteristics, the further aspects, implementation manners, and characteristics will be easy to understand with reference to the accompanying drawings and the following detailed description.

BRIEF DESCRIPTION OF DRAWINGS

In the accompanying drawings, unless otherwise specified, same numerals throughout multiple accompanying drawings may represent same or similar parts or elements. These accompanying drawings are not necessarily drawn to scale. It should be understood that these accompanying drawings only depict some implementation manners of the present disclosure and are not considered as limitations to the scope of the present disclosure.

NUMERALS IN THE DRAWINGS 110 detection circuit;
111 first clock counter;
112 second clock counter;
113 comparator;
114 temperature input pin;
115 internal register;
120 mode control circuit;
130 double-end differential circuit;
131 second PMOS;
132 third PMOS;
133 fourth PMOS;
134 third NMOS;
135 fourth NMOS;
136 fifth PMOS;
137 first CMOS inverter;
140 single-end CMOS tube;
141 second CMOS inverter;
142 fifth NMOS;
143 sixth PMOS;

144 third CMOS inverter;
150 adjustment circuit;
151 first PMOS;
152 first NMOS;
153 amplifier
154 adjustable resistor circuit;
154a first fixed-value resistor;
154b resistor group;
154c second NMOS; and
154d second fixed-value resistor.

DESCRIPTION OF EMBODIMENTS

Following descriptions merely describes some exemplary embodiments. As a person skilled in the art would realize, the described embodiments may be modified in various different ways without departing from the spirit or scope of the present disclosure. Therefore, the accompanying drawings and description are substantively considered as being illustrative but not restrictive.

A first aspect of the embodiments of the present disclosure may provide an input buffer circuit for an IC chip.

Figure 1:
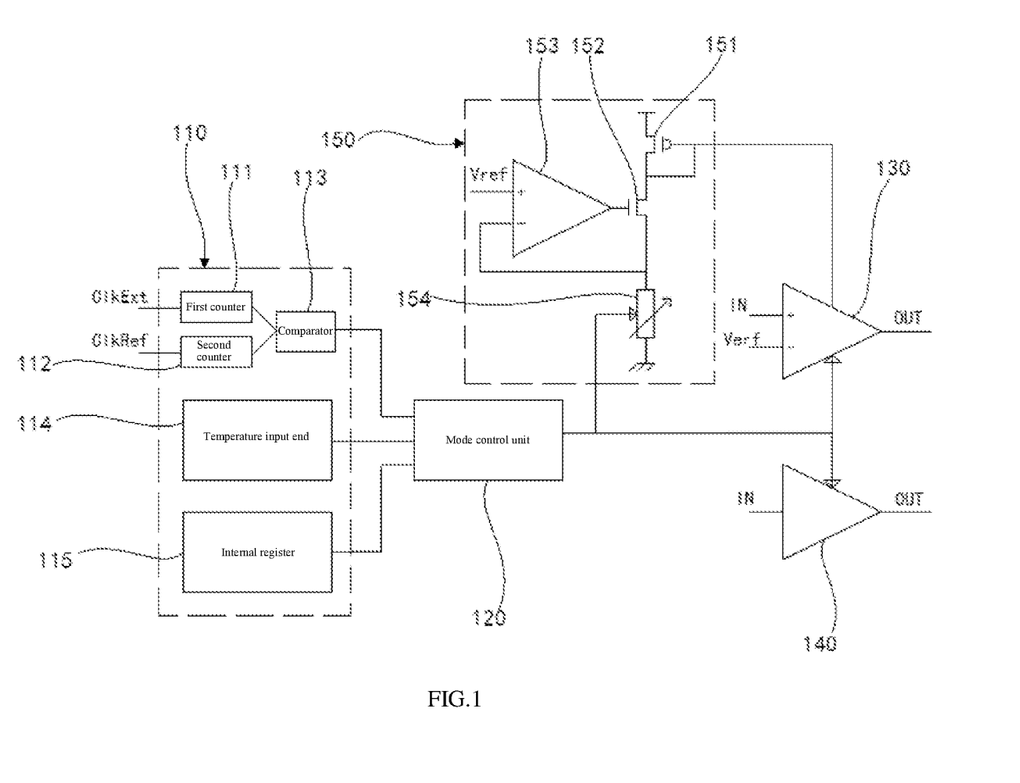
FIG. 1 is a schematic diagram of an input buffer circuit in an embodiment of the present disclosure.

Referring to FIG. 1, the input buffer circuit for the chip may include a detection circuit 110, a mode control circuit 120, a double-end differential circuit 130, and a single-end CMOS circuit 140.

The detection circuit 110 is configured to obtain a working frequency of the chip.

The mode control circuit 120 is connected to the detection circuit 110, and configured to control, according to the working frequency obtained by the detection circuit 110, an input buffer to enter either a double-end differential input mode or a single-end CMOS input mode.

The double-end differential circuit 130 is connected to the mode control circuit 120, and configured to process a high-speed data transmission at the double-end differential input mode.

The single-end CMOS circuit 140 is connected to the mode control circuit 120, and configured to process a low-speed data transmission at the single-end CMOS input mode.

In this embodiment of the present disclosure, when the working frequency obtained by the detection circuit 110 is in a high or medium frequency band, the mode control circuit 120 may control the input buffer to process the high-speed data transmission in the double-end differential input mode, and to accelerate the data processing speed when the input buffer circuit processes the high-speed data transmission in the double-end differential input mode. When the working frequency obtained by the detection circuit 110 is in a low frequency band, the mode control circuit 120 may control the input buffer to process the low-speed data transmission in the single-end CMOS input mode, and to reduce the overall power consumption of the system when the input buffer circuit processes the low-speed data transmission in the single-end CMOS input mode. Further, the input buffer circuit in this embodiment uses the mode control circuit 120 to flexibly switch between those two working modes according to the obtained working frequency, thereby achieving the maximum optimization between the speed and the power consumption.

Further, referring to FIG. 1, the detection circuit 110 may include a first clock counter 111, a second clock counter 112, and a comparator 113.

The first clock counter 111 is configured to receive and count a clock signal ClkExt of the chip.

The second clock counter 112 is configured to receive and count an internal clock signal ClkRef of the input buffer circuit. The clock signal ClkRef may be set as a reference voltage, and may be generated by an internal oscillator.

The comparator 113 is respectively connected to the first clock counter 111 and the second clock counter 112, and configured to compare counting results of the first clock counter 111 and the second clock counter 112. For example, a coded value FQ may be output by comparing the numbers of cycles of the clock signal ClkExt and the clock signal ClkRef. The coded value FQ may be used for characterizing a clock cycle of the clock signal ClkExt, thus characterizing the working frequency of the chip. If the frequency of the clock signal ClkRef is 2133 M, the clock cycle is 0.468 ns, and the FQ is "11" as shown in Table 1 below.

TABLE 1

| FQ <1:0> | |
| --- | --- |
| 00 | Clock cycle of chip <3.745 ns, 100 ns> |
| 01 | Clock cycle of chip <1.876 ns, 3.745 ns> |
| 10 | Clock cycle of chip <0.938 ns, 1.876 ns> |
| 11 | Clock cycle of chip <0.468 ns, 0.938 ns> |

Further, referring to FIG. 1, the detection circuit 110 may include a temperature input pin 114, configured to connect a temperature sensing circuit located in the chip to receive a working temperature sensed by the temperature sensing circuit of the chip. The temperature sensing circuit in the chip is generally configured to control a refresh rate. The detection circuit 110 may share the temperature sensing circuit to sense the temperature of the chip to save an internal area of the chip.

In an embodiment of the present disclosure, referring to FIG. 1, the detection circuit 110 may include an internal register 115.

The internal register 115 is connected to the mode control circuit 120, configured to register a working frequency band corresponding to the working frequency of the chip, a write latency, and a reference voltage, and further configured to register the refresh rate for reflecting the working temperature of the chip.

The mode control circuit 120 is configured to obtain the working frequency of the chip from the internal register 115 according to relationships among the working frequency band, the write latency, and the working frequency, as well as a relationship between the reference voltage and the working frequency.

The internal register 115 may be an MR13 register that meets MA [5:0]=0D$_H$ and include 8-bit operation codes. The operation codes may include an OP [7] which is a frequency set point operation (FSP-OP) mode, and an OP [6] which is a frequency set point write/read (FSP-WR), as shown in the following Table 2.

TABLE 2

| FSP-WR (Frequency Set Point Write/Read) | OP[6] | 0$_H$: Frequency-Set-Point[0] (default) 1$_H$: Frequency-Set-Point [1] | 7 |
| --- | --- | --- | --- |
| FSP-OP (Frequency Set Point Operation Mode) | OP[7] | 0$_H$: Frequency-Set-Point[0] (default) 1$_H$: Frequency-Set-Point [1] | 8 |

The internal register 115 may be an MR2 register that meets MA [5:0]=02$_H$) and includes the 8-bit operation codes. The OP [2:0] is a read latency (RL), the OP [5:3] is a write latency (WL), the OP [6] is a waken level state (WLS), and the OP [7] is a write-read level (WR Lev). When the register is at RL, the type of the register is write-only, and OP [2:0] is the operation code, the register is in a 16-bit mode meeting the relationships shown in Table 3. The register may define a relationship between the write latency and the frequency, such that the higher the frequency, the larger the write latency value.

TABLE 3

| Read Latency (nCK) | | Write Latency (nCK) | | nWR | nRTP | Lower Clock Frequency Limit | Upper Clock Frequency Limit | |
| --- | --- | --- | --- | --- | --- | --- | --- | --- |
| No DBI | w/DBI | SetA | SetB | (nCK) | (nCK) | (MHz) (>) | (MHz) (≤) | Notes |
| 6 | 6 | 4 | 4 | 6 | 8 | 10 | 266 | 1, 2, 3, |
| 10 | 12 | 6 | 8 | 10 | 8 | 266 | 533 | 4, 5, 6 |
| 14 | 16 | 8 | 12 | 16 | 8 | 533 | 800 | |
| 20 | 22 | 10 | 18 | 20 | 8 | 800 | 1066 | |
| 24 | 28 | 12 | 22 | 24 | 10 | 1066 | 1333 | |
| 28 | 32 | 14 | 26 | 30 | 12 | 1333 | 1600 | |
| 32 | 36 | 16 | 30 | 34 | 14 | 1600 | 1866 | |
| 36 | 40 | 18 | 34 | 40 | 16 | 1866 | 2133 | |

Wherein, the No DBI represents RL & nRTP for DBI-RD Disabled (MR3 OP [6]=$0_B$), the w/DBI represents RL & nRTP for DBI-RD Enabled (MR3 OP [6]=$1_B$), the nCK is the number of clock cycles, the WL Set"A" (MR2 OP [6]=$0_B$), and the WL Set"B" (MR2 OP [6]=$1_B$).

According to the low voltage small signal terminated level (LVSTL) standard, the best receiving effect can be achieved by lowering the reference voltage of the input buffer when the slew rate is within a certain range, the oscillation of a high-frequency signal at an input pin may be reduced, and a central point of the oscillation may also be lowered. As a result, the reference voltage of the high-frequency signal is smaller than a reference voltage of a low-frequency signal, that is, the reference voltage is inversely proportional to the frequency. Accordingly, the internal register may define the relationship between the reference voltage and the frequency, such that the higher the frequency, the lower the reference voltage.

The mode control circuit 120 may be further configured to obtain the working temperature of the chip from the internal register 115 according to the refresh rate. For example, the smaller the refresh rate, the lower the working temperature.

With the register in this embodiment, the mode control circuit 120 may obtain different working frequencies and working temperatures of the chip, to control the input buffer working in an appropriate mode.

In an embodiment of the present disclosure, referring to FIG. 1, the input buffer may further include an adjustment circuit 150.

An input pin of the adjustment circuit 150 is connected to the mode control circuit 120, and an output pin of the adjustment circuit 150 is connected to the double-end differential circuit 130. The adjustment circuit 150 is configured to adjust, in the double-end differential input mode, a bias current according to the working temperature and the working frequency obtained by the mode control circuit 120.

Further, the adjustment circuit 150 may include a first PMOS 151, a first NMOS 152, an amplifier 153, and an adjustable resistor circuit 154.

A source of the first PMOS 151 is connected to a power, a gate and a drain of the first PMOS 151 are shorted together, and the gate of the first PMOS 151 is connected to the double-end differential circuit 130 to generate a bias current of the double-end differential circuit 130.

A drain of the first NMOS 152 is connected to the drain of the first PMOS 151.

An output pin of the amplifier 153 is connected to a gate of the first NMOS 152, and a first input pin of the amplifier 153 is connected to the reference voltage. A first pin of the adjustable resistor circuit 154 is connected to a source of the first NMOS 152 and a second input pin of the amplifier 153, and a second pin of the adjustable resistor circuit 154 is grounded.

The mode control circuit 120 is connected to the adjustable resistor circuit 154, and configured to adjust and control, in the double-end differential input mode, the resistance of the adjustable resistor circuit 154 according to the working temperature and the working frequency obtained by the detection circuit 110, and further to adjust the bias current. In this way, by controlling the resistance of the adjustable resistor circuit 154 to adjust the magnitude of the current of the circuit, the bias current is adjusted proportionally and meets the requirement of the double-end differential input mode.

Figure 2:
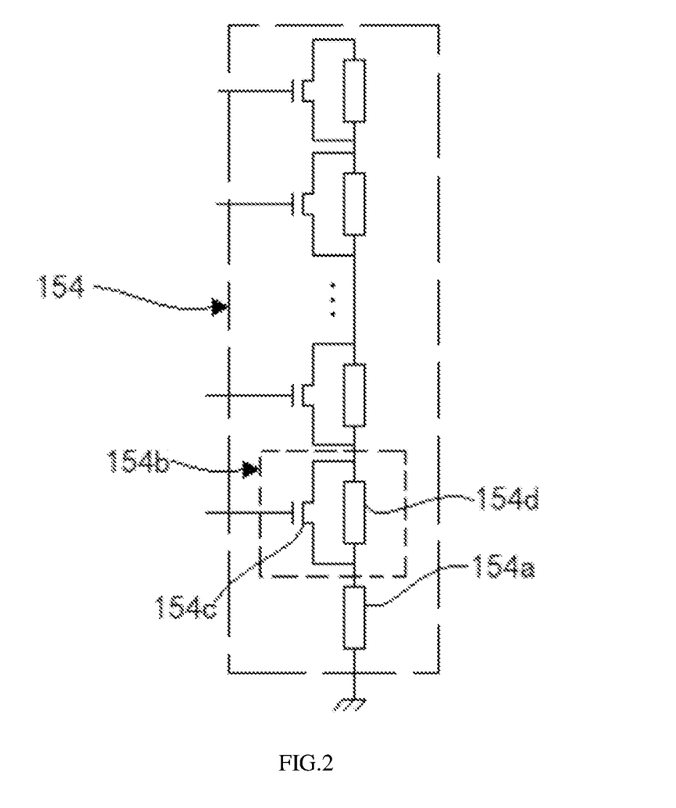
FIG. 2 is a circuit diagram of an adjustable resistor circuit in an embodiment of the present disclosure.

Further, in an embodiment of the present disclosure, referring to FIG. 2, the adjustable resistor circuit 154 may include a first fixed-value resistor 154a and an adjustable resistor.

One end of the first fixed-value resistor 154a is grounded. The first fixed-value resistor 154a is configured to prevent the shorted circuit.

The adjustable resistor is connected to the other end of the first fixed-value resistor 154a, and may include N serially-connected resistor groups 154b, wherein each of the resistor groups 154b may include a second NMOS 154c and a second fixed-value resistor 154d, a source and a drain of each second NMOS 154c are respectively connected to two ends of each second fixed-value resistor 154d, and a gate of each second NMOS 154c is connected to the mode control circuit 120. By controlling voltages input to the gates of the resistor groups 154b via the mode control circuit 120, the number the resistor groups 154b that are switched on may be controlled, and the resistance of the adjustable resistor can be adjusted.

Figure 3:
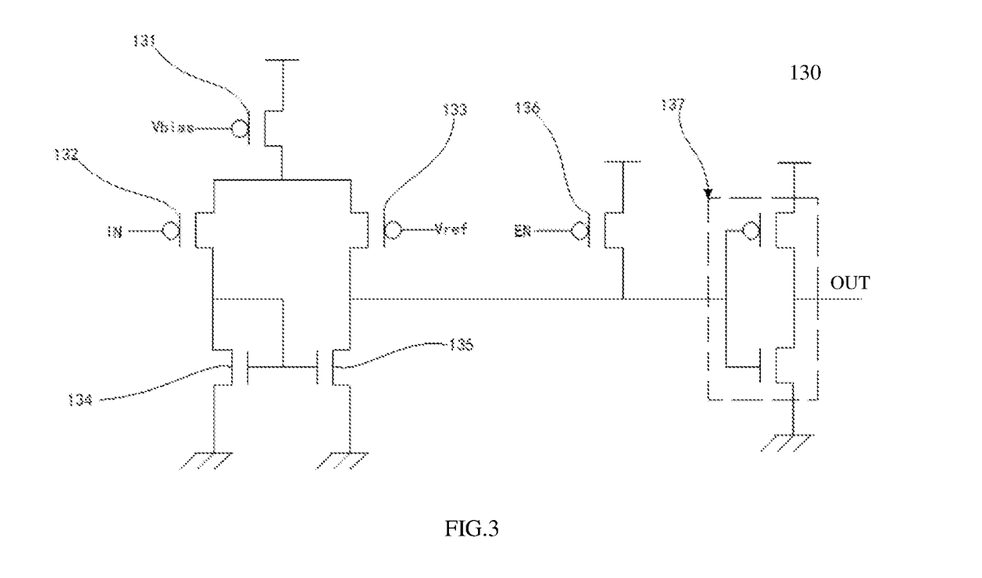
FIG. 3 is a circuit diagram of a double-end differential circuit in an embodiment of the present disclosure.

In an embodiment of the present disclosure, referring to FIG. 3, the double-end differential circuit 130 may include a second PMOS 131, a third PMOS 132, a fourth PMOS 133, a third NMOS 134, a fourth NMOS 135, a fifth PMOS 136, and a first CMOS inverter 137.

A source of the second PMOS 131 is connected to the power, and a gate of the second PMOS 131 is connected to a bias voltage.

A source of the third PMOS 132 is connected to a drain of the second PMOS 131, and a gate of the third PMOS 132 is used as a data input pin of the double-end differential circuit 130.

A source of the fourth PMOS 133 is connected to the drain of the second PMOS 131, and a gate of the fourth PMOS 133 is connected to the reference voltage.

A drain of the third NMOS 134 is connected to a drain of the third PMOS 132, a source of the third NMOS 134 is grounded, and a gate of the third NMOS 134 is shorted with the drain.

A drain of the fourth NMOS 135 is connected to a drain of the fourth PMOS 133, a source of the fourth NMOS 135 is grounded, and a gate of the fourth NMOS 135 is connected to the gate of the third NMOS 134.

A source of the fifth PMOS 136 is connected to the power, a drain of the fifth PMOS 136 is connected to a connection line connecting the drain of the fourth NMOS 135 and a drain of the fourth PMOS 133, and a gate of the fifth PMOS 136 is connected to an enable signal.

Two ends of the first CMOS inverter 137 are respectively connected to the power and a ground, an input pin of the CMOS inverter is connected to the drain of the fifth PMOS 136, and an output pin of the CMOS inverter is used as a data output pin of the double-end differential circuit 130.

With the double-end differential circuit 130 in this embodiment, when the mode control circuit 120 receives a result obtained from the detection circuit 110 that the working frequency is a high or medium frequency, the mode control circuit 120 may select the double-end differential circuit 130 for data processing, and the double-end differential circuit 130 may process the data transmission at a high speed to improve the data processing speed of the chip.

Figure 4:
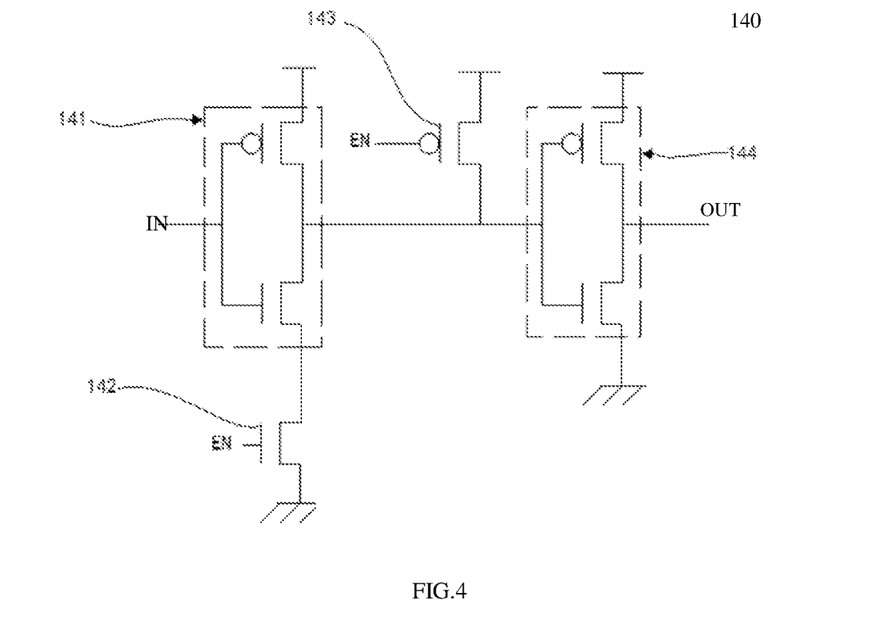
FIG. 4 is a circuit diagram of a single-end CMOS circuit in an embodiment of the present disclosure.

In an embodiment of the present disclosure, referring to FIG. 4, the single-end CMOS circuit 140 includes a second CMOS inverter 141, a fifth NMOS 142, a sixth PMOS 143, and a third CMOS inverter 144.

One end of the second CMOS inverter 141 is connected to the power, and an input pin of the second CMOS inverter 141 is used as a data input pin of the single-end CMOS circuit 140.

A drain of the fifth NMOS 142 is connected to the other end of the second CMOS inverter 141, a gate of the fifth NMOS 142 is connected to the enable signal, and a source of the fifth NMOS 142 is grounded.

A source of the sixth PMOS 143 is connected to the power, a gate of the sixth PMOS 143 is connected to the enable signal, and a drain of the sixth PMOS 143 is connected to an output pin of the second CMOS inverter 141.

Two ends of the third CMOS inverter 144 are respectively connected to the power and the ground, an input pin of the third CMOS inverter 144 is connected to a drain of the sixth PMOS 143, and an output pin of the third CMOS inverter 144 is used as a data output pin of the single-end CMOS circuit 140.

With the single-end CMOS circuit 140 in this embodiment, when the mode control circuit 120 receives a result obtained from the detection circuit 110 that the working frequency is a low frequency, the mode control circuit 120 may select the single-end CMOS circuit 140 for data processing; and the single-end CMOS circuit 140 may save the energy and reduce the power consumption of the data processing of the chip.

Figure 5:
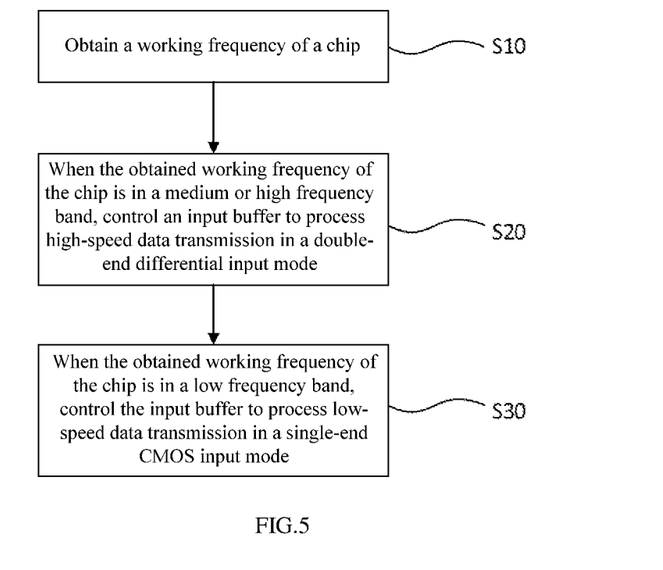
FIG. 5 is a flowchart of an intelligent optimization method of an input buffer circuit in an embodiment of the present disclosure.

A second aspect of the present disclosure provides an intelligent optimization method of an input buffer circuit. Referring to FIG. 5, the method may include the following steps.

In step S10, a working frequency of a chip may be obtained.

In step S20, when the obtained working frequency of the chip is in a medium or high frequency band, an input buffer is controlled to process high-speed data transmission in a double-end differential input mode.

In step S30, when the obtained working frequency of the chip is in a low frequency band, the input buffer is controlled to process low-speed data transmission in a single-end CMOS input mode.

Figure 6:
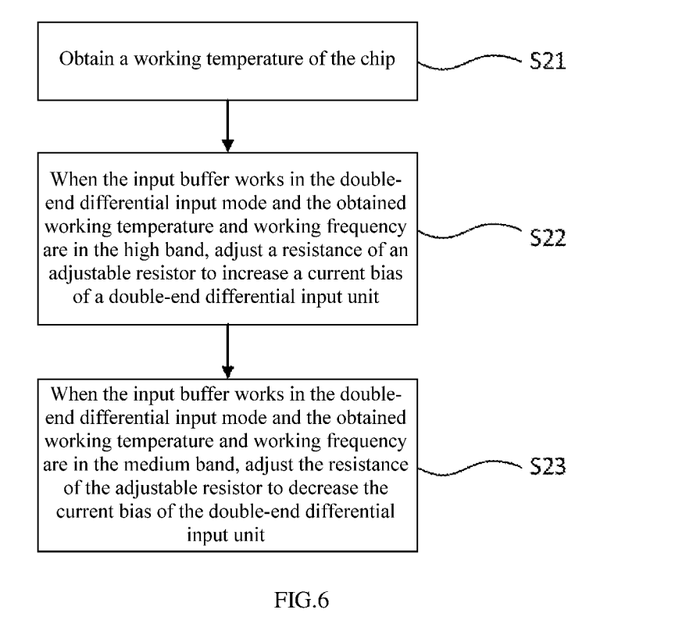
FIG. 6 is a flowchart of an intelligent optimization method of an input buffer circuit in another embodiment of the present disclosure.

In an embodiment of the present disclosure, referring to FIG. 6, after the step S20 of controlling an input buffer to process high-speed data transmission in a double-end differential input mode when the obtained working frequency of the chip is in a medium or high frequency band, the method may further include the followings.

In step S21, a working temperature of the chip may be obtained.

In step S22, when the input buffer works in the double-end differential input mode and the obtained working temperature and working frequency are in the high band, a resistance of an adjustable resistor may be adjusted to increase a bias current of a double-end differential circuit.

In step S23, when the input buffer works in the double-end differential input mode and the obtained working temperature and working frequency are in the medium band, the resistance of the adjustable resistor may be adjusted to decrease the bias current of the double-end differential circuit.

A third aspect of the present disclosure provides a semiconductor memory including the above-disclosed input buffer circuit in any embodiment of the present disclosure.

The input buffer circuit in the semiconductor memory in this embodiment of the present disclosure uses a mode control circuit 120 to flexibly switch between two working modes according to an obtained frequency, thus achieving the best optimization between the speed and the power consumption, and improving performance of the semiconductor memory.

The above are merely some specific implementation manners of the present disclosure, and the protection scope of the present disclosure is not limited thereto. Various changes or substitutions readily conceivable by the person skilled in the art within the technical scope of the present disclosure should be included in the protection scope of the present disclosure. Therefore, the protection scope of the present disclosure should be subject to the protection scope of the claims.

In the description of the present disclosure, it should be understood that, orientation or position relationships indicated by the terms "center", "longitudinal", "transversal", "length", "width", "thickness", "upper", "lower", "front", "rear", "left", "right", "vertical", "horizontal", "top", "bottom", "inner", "outer", "clockwise", "counterclockwise", "axial", "radial", "peripheral", etc. are based on the orientation or position relationships as shown in the drawings, for ease of the description of the present disclosure and simplifying the description only, rather than indicating or implying that the indicated device or element must have a particular orientation or be constructed and operated in a particular orientation. Therefore, these terms should not be understood as a limitation to the present disclosure.

In addition, the terms such as "first" and "second" are merely for a descriptive purpose, and shall not be understood as indicating or implying relative importance, or implicitly indicating the number of the indicated technical features. Hence, the features defined by "first" and "second" can explicitly or implicitly include one or more features. In the description of the present disclosure, "a plurality of" means two or more, unless otherwise stated.

In the description of the present disclosure, unless otherwise specified and defined explicitly, the terms such as "install", "connected with", "connected to" and "fixed" should be comprehended in a broad sense. For example, these terms may be comprehended as being fixedly connected, detachably connected, or integrally connected; mechanically connected, electrically connected or communicated; or directly connected or indirectly connected through an intermediate medium, or in an internal communication between two elements or an interactive relationship between two elements. The specific meanings about the foregoing terms in the present disclosure may be understood by the person of ordinary skill in the art according to specific circumstances.

In the present disclosure, unless otherwise specified and defined explicitly, the first feature is "above" or "below" the second feature, which may include that the first feature and the second feature are in direct contact, and may also include that the first feature and the second feature are not in direct contact but are in contact via another feature therebetween. Moreover, the first feature is "above", "over" and "on" the second feature, which includes that the first feature is above the second feature and at an inclined top of the second feature, or only indicates that a horizontal height of the first feature is higher than a horizontal height of the second feature. The first feature is "below", "underneath" and "under" the second feature, which includes that the first feature is below the second feature and at an inclined bottom of the second feature, or only indicates that a horizontal height of the first feature is smaller than a horizontal height of the second feature.

Many different embodiments or examples are provided to implement different structures of the present disclosure. In order to simplify the present disclosure, the components and arrangements for special examples are described above. Certainly, the above are merely for examples and are not intended to limit the present disclosure. Additionally, reference numbers and/or reference letters may be repeated in different examples of the present disclosure, and such a repetition is for the purposes of simplicity and clarity and substantially does not indicate a relationship between the discussed implementation manners and/or arrangements. Besides, although examples on various special processes and materials are provided in the present disclosure, the person of ordinary skill in the art may be aware of the application of other processes and/or use of other materials.

What is claimed is:

1. An input buffer circuit for a chip, comprising:
   a detection circuit configured to obtain a working frequency of the chip;
   a mode control circuit connected to the detection circuit and configured to control, according to the working frequency obtained by the detection circuit, an input buffer to enter a double-end differential input mode or a single-end complementary metal oxide semiconductor (CMOS) input mode;
   a double-end differential circuit connected to the mode control circuit and configured to process a high-speed data transmission in the double-end differential input mode; and
   a single-end CMOS circuit connected to the mode control circuit and configured to process a low-speed data transmission in the single-end CMOS input mode.

2. The input buffer circuit according to claim 1, wherein the detection circuit comprises:
   a first clock counter configured to receive and count a clock signal of the chip;
   a second clock counter configured to receive and count an internal clock signal of the input buffer circuit; and
   a comparator respectively connected to the first clock counter and the second clock counter, configured to compare counting results of the first clock counter and the second clock counter, and output the working frequency.

3. The input buffer circuit according to claim 2, wherein the detection circuit comprises a temperature input pin connected to a temperature sensing circuit located in the chip, to receive a working temperature sensed by the temperature sensing circuit of the chip.

4. The input buffer circuit according to claim 1, wherein the detection circuit comprises an internal register connected to the mode control circuit, configured to register a working frequency band corresponding to the working frequency of the chip, a write latency, and a reference voltage, and configured to register a refresh rate reflecting the working temperature of the chip; and
   the mode control circuit is configured to obtain the working frequency of the chip from the internal register according to a relationship among the working frequency band, the write latency and the working frequency, and a relationship between the reference voltage and the working frequency, and further configured to obtain the working temperature of the chip according to the refresh rate.

5. The input buffer circuit according to claim 4, further comprising:
   an adjustment circuit comprising an input pin connected to the mode control circuit and an output pin connected to the double-end differential circuit, and configured to adjust, in the double-end differential input mode, a bias current according to the working temperature and the working frequency obtained by the mode control circuit.

6. The input buffer circuit according to claim 5, wherein the adjustment circuit comprises:
   a first p-channel metal oxide semiconductor (PMOS) comprising a source connected to a power, a gate shorted with a drain, and the gate connected to the double-end differential circuit for generating a bias current of the double-end differential circuit;
   a first n-channel metal oxide semiconductor (NMOS) comprising a drain connected to the drain of the first PMOS;
   an amplifier comprising an output pin connected to a gate of the first NMOS, and a first input pin connected to the reference voltage; and
   an adjustable resistor circuit comprising a first pin respectively connected to a source of the first NMOS and a second input pin of the amplifier, and a second pin being grounded;
   wherein the mode control circuit is connected to the adjustable resistor circuit, and configured to adjust and control, in the double-end differential input mode, a resistance of the adjustable resistor circuit to adjust the bias current according to the working temperature and the working frequency obtained by the detection circuit.

7. The input buffer circuit according to claim 3, further comprising:
an adjustment circuit comprising an input pin connected to the mode control circuit and an output pin connected to the double-end differential circuit, and configured to adjust, in the double-end differential input mode, a bias current according to the working temperature and the working frequency obtained by the mode control circuit.

8. The input buffer circuit according to claim 7, wherein the adjustment circuit comprises:
a first p-channel metal oxide semiconductor (PMOS) comprising a source connected to a power, a gate shorted with a drain, and the gate connected to the double-end differential circuit for generating a bias current of the double-end differential circuit;
a first n-channel metal oxide semiconductor (NMOS) comprising a drain connected to the drain of the first PMOS;
an amplifier comprising an output pin connected to a gate of the first NMOS, and a first input pin connected to the reference voltage; and
an adjustable resistor circuit comprising a first pin respectively connected to a source of the first NMOS and a second input pin of the amplifier, and a second pin being grounded;
wherein the mode control circuit is connected to the adjustable resistor circuit, and configured to adjust and control, in the double-end differential input mode, a resistance of the adjustable resistor circuit to adjust the bias current according to the working temperature and the working frequency obtained by the detection circuit.

9. The input buffer circuit according to claim 8, wherein the adjustable resistor circuit comprises:
a first fixed-value resistor comprising one end being grounded; and
an adjustable resistor connected to the other end of the first fixed-value resistor, and comprising N serially-connected resistor groups, wherein each of the resistor groups comprises a second NMOS and a second fixed-value resistor, a source and a drain of each second NMOS are respectively connected to two ends of each second fixed-value resistor, and a gate of each second NMOS is connected to the mode control circuit.

10. The input buffer circuit according to claim 7, wherein the double-end differential circuit comprises:
a second PMOS comprising a source connected to the power and a gate connected to a bias voltage;
a third PMOS comprising a source connected to a drain of the second PMOS and a gate used as a data input pin of the double-end differential circuit;
a fourth PMOS comprising a source connected to the drain of the second PMOS and a gate connected to the reference voltage;
a third NMOS comprising a drain connected to a drain of the third PMOS, a source being grounded, and a gate shorted with the drain;
a fourth NMOS comprising a drain connected to a drain of the fourth PMOS, a source being grounded, and a gate connected to the gate of the third NMOS;
a fifth PMOS comprising a source connected to the power, a drain connected to a connection line connecting the drain of the fourth NMOS and a drain of the fourth PMOS, and a gate connected to an enable signal; and
a first CMOS inverter, comprising two ends respectively connected to the power and a ground, an input pin connected to the drain of the fifth PMOS, and an output pin used as a data output pin of the double-end differential circuit.

11. The input buffer circuit according to claim 10, wherein the single-end CMOS circuit comprises:
a second CMOS inverter comprising one end connected to the power and an input pin used as a data input pin of the single-end CMOS circuit;
a fifth NMOS comprising a drain connected to the other end of the second CMOS inverter, a gate connected to the enable signal, and a source being grounded;
a sixth PMOS comprising a source connected to the power, a gate connected to the enable signal, and a drain connected to an output pin of the second CMOS inverter; and
a third CMOS inverter comprising two ends respectively connected to the power and the ground, an input pin connected to a drain of the sixth PMOS, and an output pin used as a data output pin of the single-end CMOS circuit.

12. An intelligent optimization method of an input buffer circuit, comprising:
obtaining working frequency information of a chip;
when a working frequency of the chip is in a medium or high frequency band, controlling an input buffer to process a high-speed data transmission in a double-end differential input mode; and
when the working frequency of the chip is in a low frequency band, controlling the input buffer to process a low-speed data transmission in a single-end complementary metal oxide semiconductor (CMOS) input mode.

13. The method according to claim 12, after controlling the input buffer to operate in the double-end differential input mode when a working frequency of the chip is in a medium or high frequency band, further comprising:
obtaining a working temperature of the chip;
when the input buffer operates in the double-end differential input mode and the obtained working temperature and working frequency are in the high band, adjusting a resistance of an adjustable resistor to increase a bias current of a double-end differential circuit; and
when the input buffer operates in the double-end differential input mode and the obtained working temperature and working frequency are in the medium band, adjusting the resistance of the adjustable resistor to decrease the bias current of the double-end differential circuit.

14. The method according to claim 12, further comprising registering a working frequency band corresponding to the working frequency in an internal register.

15. The method according to claim 14, wherein obtaining the working frequency includes obtaining the working frequency according to correlations among the working frequency band, a write latency, the working frequency, and a reference voltage of the input buffer.

16. The method according to claim 12, further comprising registering a refresh rate corresponding to the working temperature in an internal register.

17. The method according to claim 16, wherein obtaining the working temperature includes obtaining the working temperature according to the fresh rate.

18. The method according to claim 12, further comprising adjusting a reference voltage of the input buffer according to the working frequency.

19. A semiconductor memory manufacturing method, comprising an intelligent optimization method, wherein the intelligent optimization method comprises:
   obtaining working frequency information of a chip;
   when a working frequency of the chip is in a medium or high frequency band, controlling an input buffer to process a high-speed data transmission in a double-end differential input mode; and
   when the working frequency of the chip is in a low frequency band, controlling the input buffer to process a low-speed data transmission in a single-end complementary metal oxide semiconductor (CMOS) input mode.

20. A semiconductor memory having an optimization between a speed and a power consumption and made by a process comprising the steps of:
   obtaining working frequency information of a chip;
   when a working frequency of the chip is in a medium or high frequency band, controlling an input buffer to process a high-speed data transmission in a double-end differential input mode; and
   when the working frequency of the chip is in a low frequency band, controlling the input buffer to process a low-speed data transmission in a single-end complementary metal oxide semiconductor (CMOS) input mode.

\* \* \* \* \*